(12) United States Patent
Schmid et al.

(10) Patent No.: US 9,480,992 B2
(45) Date of Patent: Nov. 1, 2016

(54) METHOD FOR THE SEPARATION OF POLARIZABLE BIOPARTICLES

(75) Inventors: Andreas Schmid, Dortmund (DE);
Lars M. Blank, Dortmund (DE);
Steffen Howitz, Dresden (DE);
Frederik Sven Ole Fritzsch, Cologne (DE)

(73) Assignee: Technische Universitat Dortmund, Dortmund (DE)

( * ) Notice: Subject to any disclaimer, the term of this patent is extended or adjusted under 35 U.S.C. 154(b) by 210 days.

(21) Appl. No.: 14/116,643

(22) PCT Filed: May 9, 2012

(86) PCT No.: PCT/EP2012/058575
§ 371 (c)(1),
(2), (4) Date: Feb. 24, 2014

(87) PCT Pub. No.: WO2012/152844
PCT Pub. Date: Nov. 15, 2012

(65) Prior Publication Data
US 2015/0122653 A1    May 7, 2015

(30) Foreign Application Priority Data

May 10, 2011  (DE) .......................... 10 2011 050 254

(51) Int. Cl.
*B03C 5/00*       (2006.01)
*B03C 5/02*       (2006.01)
(Continued)

(52) U.S. Cl.
CPC ............ *B03C 5/005* (2013.01); *B01L 3/50273* (2013.01); *B03C 5/026* (2013.01); *B81B 7/02* (2013.01); *B01L 2400/0424* (2013.01); *B03C 2201/26* (2013.01)

(58) Field of Classification Search
CPC ................... B01F 13/0001; B01L 2400/0424; B01L 2400/0415; B01L 2400/0421; B03C 5/00; G01N 27/221; G01N 27/447; B01D 57/02; B01D 59/38; C07K 1/26
See application file for complete search history.

(56) References Cited

U.S. PATENT DOCUMENTS

2002/0036142 A1\* 3/2002 Gascoyne ............... B03C 5/026
204/547
2004/0226819 A1  11/2004 Talary et al.
(Continued)

FOREIGN PATENT DOCUMENTS

DE    10 2004 017 482 A1    7/2005
DE    10 2006 002 462 A1    7/2007
(Continued)

OTHER PUBLICATIONS

Kuse et al. (Blut (1985) 50:243-248).\*
(Continued)

*Primary Examiner* — Jennifer Dieterle
(74) *Attorney, Agent, or Firm* — Reising Ethington P.C.

(57) ABSTRACT

The invention relates to a method for the separation of a polarizable bioparticle comprising the steps: a) dielectrophoretic preseparation of a polarizable bioparticle from a suspension of bioparticles; b) fluidic separation of the selected bioparticle by fixing the bioparticle in a dielectrophoretic field cage and circulating fluid around the bioparticle; c) transferring the separated bioparticle from the dielectrophoretic field cage to a culture chamber; d) dielectrophoretic fixing of the separated bioparticle in the culture chamber and study, observation, manipulation and/or culturing of the separated bioparticle. The invention further relates to a microfluidic system and use thereof.

5 Claims, 8 Drawing Sheets

(51) Int. Cl.
    *B01L 3/00*         (2006.01)
    *B81B 7/02*         (2006.01)

(56)            References Cited

U.S. PATENT DOCUMENTS

| 2007/0125941 | A1 | 6/2007 | Lee et al. | |
|---|---|---|---|---|
| 2007/0240495 | A1 | 10/2007 | Hirahara | |
| 2009/0071831 | A1* | 3/2009 | Chen | G01N 27/447 204/547 |
| 2009/0092989 | A1 | 4/2009 | Chang et al. | |
| 2010/0170797 | A1 | 7/2010 | Arlett et al. | |
| 2011/0083961 | A1* | 4/2011 | Muller | B01L 3/502761 204/451 |

FOREIGN PATENT DOCUMENTS

| WO | 99/61888 | 12/1999 |
|---|---|---|
| WO | 2007/088517 A2 | 8/2007 |
| WO | 2009/027927 A2 | 3/2009 |
| WO | 2010/115167 A2 | 10/2010 |

OTHER PUBLICATIONS

Schnelle, T.; Muller, T.; Fuhr, G.: Trapping in AC octode field cases; J Electrostat Bd. 50, 2000; pp. 17-29.
Muller, T.; Pfenning, A.; Klein, P.; Gradl, G.; Jager, M.; Schnelle, T.: "The Potential of Dielectrophoresis for Single-Cell Experiments." IEEE Eng. Med. Biol. Bd. 22, 2003; pp. 51-61.
Kortmann, H.; Blank, L.M.; Schmid, A.: A rapid, reliable, and automatable lab-on-a chip interface; Lab Chip Bd. 9, 2009; pp. 1455-1460.
International Search Report [Translated] for PCT/EP2012/058575 dated Oct. 12, 2012, 5 pages.
PCT International Preliminary Report on Patentability for International application No. PCT/EP2012/058575; dated Nov. 12, 2013, 4 pages.

* cited by examiner

METHOD FOR THE SEPARATION OF POLARIZABLE BIOPARTICLES

TECHNICAL FIELD

The invention relates to a method for the separation of a polarizable bioparticle, a microfluidic system and its use.

BACKGROUND

The examination of isolated cells is a declared goal in science. There are numerous microfluidic chips with which one attempts to capture single cells with surface interactions in gels or force fields, for example optical tweezers, magnetic, acoustic, positive or negative dielectrophoretic interactions, in the flowing medium, in order to be able to cultivate and analyze them separately. What is disadvantageous with optical tweezers is that the cells are kept at an energy maximum which leads to a rapid temperature rise in the cell. Moreover, many methods are too weak to trap the cells in the microfluidic stream contactlessly.

Manipulation of particles by means of dielectrophoresis is a known technology and the separation and sorting of even larger cells is a main use of dielectrophoresis. With positive dielectrophoresis (pDEP) cells are drawn to the electrodes and stick to these by dielectric polarization. The cells are freed again by switching off the AC field. Positive dielectrophoresis has the disadvantage that the cells come in contact with the electrodes and are held in the area of the highest force field intensity. An increase of temperature at the electrodes (Eng. Joule heating) often kills off cells. With negative dielectrophoresis (nDep), cells are repelled from the electrodes. This can be used with a certain three-dimensional arrangement to accumulate cells in the field minimum contactlessly or to capture them in the flowing medium. In this connection, cells can be trapped in a field cage of high-frequency nDEP fields that are produced by activations of octupoles, as an example.

Microfluidic devices for dielectrophoretic separation or accumulation of cells are known. However, with the system described it is disadvantageous with the capture of a cell to agglomerate subsequent cells by nDEP repulsion and in the subsequent single-cell cultivation they adhered in large numbers in the vicinity of the cultivated cell, particularly in the same fluid stream, or were even drawn into the fluid stream going into the analysis. If there are more cells in a microfluidic channel quickly secreted substances can be exchanged from cell to cell over the short diffusion paths. Uncontrolled exchange leads to undefined environmental conditions during single-cell cultivation. Isolation and separate, contactless cultivation, however, is helpful for defined cultivation conditions.

SUMMARY

One object of the present disclosure is to provide a method that overcomes at least one of the above-mentioned disadvantages. In particular, one object of the present disclosure is to provide a method that allows isolation and controlled cultivation of microorganisms or cells in fluids.

This problem is resolved by a method for separation of a polarizable bioparticle with a microfluidic system comprising the following steps:
a) dielectrophoretic preseparation of a polarizable bioparticle from a suspension of bioparticles;
b) fluidic separation of the selected bioparticle by trapping the bioparticle in a dielectrophoretic field cage and circulating fluid around the bioparticle;
c) transfer of the separated bioparticle from the dielectrophoretic field cage into a cultivation chamber;
d) dielectrophoretic trapping of the separated bioparticle in the cultivation chamber and study, observation, manipulation and/or cultivation of the separated bioparticle.

Surprisingly, it was found that one embodiment of the method of the disclosure allows the intended controllable and contactless isolation even of very small microorganisms or single cells from fluid streams. In particular, the method of the disclosure allows an active isolation and cultivation under controlled conditions of single microorganisms or cells smaller than 5 µm by means of negative dielectrophoresis in microfluids. Thus, the method of the disclosure allows contactless cultivation of single microorganisms or cells smaller than 5 µm in microfluids. One advantage may be that by this means single microorganisms or single cells can be cultivated under defined environmental conditions in fluids. In particular, the disclosure further enables us to take samples of cells that are living, contactless and cultivated under defined conditions, particularly cells that are smaller than 5 µm. The disclosure allows the researcher to influence the environmental conditions of the single, cultivated cells systematically, since the cell is no longer chemically in balance with its environment, but constantly being bathed with fresh medium. A chip, which can additionally control physical conditions, such as temperature, is also designated as an envirostat. In this way, additional information, for example, about the single cell can be used with the buildup of metabolic balance. The disclosure further enables the electroporation of isolated single microorganisms or single cells under defined environmental conditions for the introduction of foreign DNA, for cell fusion or cell lysis.

One embodiment of the method of the disclosure enables a stable contactless isolation and cultivation of single cells or microorganisms in microfluids. The cells can be isolated from cultures, be transferred to a cultivation chamber and, there defined, be cultivated even over a longer time in fluid. The disclosure further enables taking samples of the living cell and then from the chip, for instance, transferring it alive to a cultivation vessel for further cultivation.

The disclosure enables targeted access to data from single cell balances for systematic description of biological mechanisms. Single cell perturbation experiments can be carried out in order to detect, for example, cell responses to stress signals as they decisively affect the yield in biotechnological productions. Cell responses can be catalogued and be classed with biological mechanisms. In the context of system biology the disclosure thus enables the identification and standardization of cell responses in order to analyze intracellular mechanisms disconnected from variability and without uncontrolled influences by other cells in a population. Pathogenic, single bacteria cultivated and targeted with active substances can be perturbed to contain effectiveness in cellular mechanisms under clearly defined conditions, in order to develop better active substances systematically.

In the context of the present disclosure, the concept "microfluidic system" is to be understood as a system that has such small dimensions of microchannels that the fluid flow is laminar without forming turbulence.

In the context of the present disclosure, the concept "bioparticle" is to be understood as particles in general. In particular, the concept bioparticle includes biological cells, cell group, cell components or organelles or biologically relevant micromolecules. The concept bioparticle is particularly not limited to single biological cells.

In the context of the disclosure, the concept "analyte" or "analytes" is to be understood as those materials contained in a sample about which a statement should be made, particularly in a chemical analysis.

One embodiment of the method of the disclosure comprises a dielectrophoretic preseparation of a polarizable bioparticle from a suspension. Dielectrophoretic methods are negative dielectrophoretic methods, in particular. Negative dielectrophoresis (nDEP) allows us to hold cells in an energy minimum and thus in regulated temperature, without contact in fluid streams. Dielectrophoretic preseparation enables separation of the selected bioparticle from other bioparticles, as an example, a cell to be separated from other cells such as from a cell suspension. In this way, a cell can be separated from other cells of a cell suspension. In particular, through dielectrophoretic preseparation the particles that cling to the channel walls can be separated from other particles. This may be especially advantageous for the separation of bacteria cells.

The separation of dead cells and their remains or debris is not possible by dielectrophoretic methods, since these are no longer sufficiently polarizable by the applied AC field to be able to divert them with microelectrode arrays.

In a further step b), another fluidic separation of the selected bioparticle takes place by trapping the bioparticle in a dielectrophoretic field cage and surrounding the bioparticle with a stream of fluid.

In the context of the disclosure, the concept "fluidic separation" is to be understood in that the bioparticle is separated by a fluid stream, where, according to this disclosure, the selected bioparticle is captured in a dielectrophoretic field cage and surrounded by the stream of fluid. By this means, the selected bioparticle can be separated from other scattered polarizable bioparticles existing in the fluid as well as dead cells and their remains, which cannot be separated dielectrophoretically.

In the next step, the separated bioparticle is transferred out of the dielectrophoretic field cage into a cultivation chamber. It may be advantageous to separate the areas of isolation and cultivation spatially, as the particle, in this way, can be transferred for investigation into a microchannel area that is not contaminated by bonded cells or cell remains. It may be particularly advantageous if the cultivation chamber does not lie in a linear extension of the microchannel in which the separation takes place. Preferably, the cultivation chamber lies in a microchannel that lies in an angle to the microchannel in which the separation takes place. In this way, contamination by secreted substances of foreign cells and cell remains is further reduced.

In the cultivation chamber, the separated bioparticle can be dielectrophoretically fixed and studied, observed, manipulated and/or cultivated. One particular advantage may be that the present disclosure enables us to take samples of single cells that are living, contactless and cultivated under defined conditions. In particular, the disclosure also enables the isolation of cell lysate from single cells of a cell suspension. In one advantageous manner, this enables the chemical or physical, contactless perturbation of single microorganisms or smaller single cells in streams under conditions defined by the researcher.

One particular advantage may be that one embodiment of the method of the disclosure enables analytes of a single bioparticle to be studied. Thus, the fluid can be carried off downstream from the cultivation chamber for sample taking, directly analyzed or be transferred for analysis in an analysis apparatus outside of the microfluidic system. Especially to one advantage, the fluid contains only the secretions of the selected bioparticle without impurities distorting the measurements by other bioparticles.

The separation steps of one embodiment of the method of the disclosure can prevent extracellular substances of other cells from getting into the analysis area for analysis of the bioparticle. Isolation of secreted substances of a cell also enables non-optical based analysis of single microorganisms, for example by means of mass spectroscopy.

In preferred embodiments of the method of the disclosure analytes of the separated bioparticle for analysis are carried off from the cultivation chamber. The analytes can, as an example, be carried off into a measuring station.

One embodiment of the method of the disclosure enables optical based and non-optical based analysis of bioparticles, in particular, single microorganisms or singles cells in fluid streams. Examples for optical methods are microscopic, spectroscopic or fluorescence-based optical measuring methods. An example for non-optical based analysis is analysis by means of mass spectroscopy.

Observation of the separated bioparticles can be carried out with optical methods.

In preferred embodiments of the method of the disclosure, the analytes of the separated bioparticle can be analyzed with optical and/or non-optical methods. In particular, study of the separated bioparticle or its analytes can be carried out with non-optical methods. This allows a far more comprehensive study of bioparticles than what could have been available merely by the optical method common up to now. Examples for non-optical methods are mass spectroscopic methods. Mass spectroscopic methods enable, for example, analyses of metabolic flow with single defined cultivated and defined perturbed cells. Further examples of non-optical methods usable in microfluidic systems are chromatographic methods, the HPLC (high-pressure liquid chromatography) method, for example, as well as electrochemical methods of amperometry or bioelectrical impedance analysis. A chromatographic separation is even preferred, for example, with nano-HPLC systems and subsequent detection with optical, e.g., fluorescence spectroscopic or/and with non-optical mass spectroscopic analysis methods.

In particular, the disclosure makes accessible a non-direct, optical analysis outside of the chip for single cell analysis. Above all, it may be advantageous that identical biomolecules produced from all cells no longer mix with each other by use of the method of the disclosure and thus can be assigned to the one cultivated cell.

Quantitative analysis of the bioparticle is enabled, in particular, by non-optical methods.

By manipulation of the separated bioparticle is to be understood particularly that we can expose the bioparticle to systematic chemical or physical influences. As an example, the bioparticle can be surrounded with substances of a specific concentration by means of the fluid. By manipulation, perturbation especially is understood. The concept "perturbation" is in the context of the present disclosure to be understood in the meaning of a biological system, a cell for example, particularly produced by a signal that, in a system, leads to compensation or regulation processes and influences its function.

It can be preferable to control the temperature of the fluid during study, observation and/or manipulation of the separated bioparticle.

The separated bioparticle is dielectrophoretically trapped in the cultivation chamber. In preferred embodiments of the method of the disclosure, dielectrophoretic fixing of the separated bioparticle in the cultivation chamber occurs in a further field cage and/or by means of a preferably V-shaped electrode arrangement. It may be preferred that the dielectrophoretic trapping takes place by means of a further dielectrophoretic field cage. Trapping the particles in a field cage may be advantageous, since the particles can be better studied in a fixed position. Particularly, a dielectrophoretic field cage allows a stable and contactless manipulation and capture of microorganisms with low voltages in high-frequency alternating fields.

Use of an octupole to produce the field cage may be preferred. The construction and function of a field cage in microfluids is known to the person skilled in the art, as well as the dimensioning of the octupole for the production of the field cage suited to the size distribution of the particles, especially microorganisms. The concept of a field cage used in the context of the disclosure is, however, not limited to the constructive design of an octupole. Electrodes can be realized in the most different types of design, for example, two planar opposing rings, ring-forming tips of one or more electrodes on one plane, hexagons or otherwise edged or rounded electrodes. In common construction, however, at least two opposing electrodes are required.

In some preferred embodiments, the cultivation chamber as well as the separating chamber has a field cage. Mostly, the first field cage of the separating chamber is no longer needed after the release of the bioparticle into the cultivation chamber. In further embodiments, the first field cage of the separating chamber can be used even for cultivating. This enables parallel cultivation of mother and daughter cells, for example.

Alternatively, the separated bioparticle can be trapped in the cultivation chamber preferably by means of a hook-shaped, electrode arrangement in the microfluidic stream. Preferably, the tip of the hook shape has an additional edge, which is linearly connected with the top edge vertically to the flow direction of the fluid. Preferably, the additional edge has a length that is three times greater than the average diameter of the cell. A hook-formed electrode arrangement also allows a bioparticle, especially a cell, to be cultivated, perturbed and analyzed with the help of the microstream without contact in the fluid, particularly in medium. The fluid can be any suitable medium, particularly an aqueous solution, for instance a cell culture medium, a buffer or salt solution or similar solutions.

The voltage interval for study, observation, manipulation and/or cultivation of the separated bioparticle is preferably in the range of $\geq 0.05$ V to $\leq 8$ V, more preferably in the range of $\geq 0.1$ V to $\leq 6$ V, most preferably in the range of $\geq 1.5$ V to $\leq 2$ V. The preferred voltage range can be used suitably especially for the defined cultivation with an installed temperature sensor in order to be able to regulate systematically and very quickly the temperature in the microcultivation chamber. Thus, temperature perturbations with defined cultivated single cells are enabled, as well.

The so-called effective voltage acting on the bioparticle, for study, observation, manipulation and/or cultivation of the separated bioparticle, can lie in the range from $\geq 0.5$ V to $\leq 3$ V, preferably in the range from $\geq 0.75$ V to $\leq 2$ V. The effective voltage can be chosen in dependence on the field cage and the size of the bioparticle to be understood. As an example, the effective voltage for study of cancer cells with a distance between the electrodes of the field cage, for example an octupole electrode configuration, of ca. 20 µm is in the range of $\geq 0.5$ V to $\leq 1.5$ V. Stronger force fields can be used for measuring of the mechanical property of cells that change, for instance, with red blood corpuscles of an HIV or malaria infections. Through a change of voltages, such as a lowest possible voltage to capture and hold a cell, and a higher voltage to compress around a cell, how the cell behaves after release can be observed. Alternatively, the cell can be conducted through a defined force field that is used for measuring the cell size at the same time, whereby the cell deforms by passing through the force field. This can be observed through changes in the temporal course of a resistance measurement.

Preferred bioparticles are specifically biological cells, cell groups, cell components or cell organelles. Preferred cells are bacteria, eukaryotic cells, particularly cancer cells, blood cells, viruses or yeast cells. In particular, cell organelles such as mitochondria or chloroplasts are bioparticles.

Preferably the bioparticles have a size or average diameter of $\leq 5$ µm, more preferably $\leq 4$ µm. By size of a bioparticle the average diameter of the bioparticle, such as a cell, is to be understood. In preferred embodiments, the bioparticles have a size or average diameter in the range of $\geq 0.5$ µm to $\leq 5$ µm. Yet to be preferred, the bioparticles have a size of average diameter in the range of $\geq 1$ µm to $\leq 5$ µm, more preferably in the range from $\geq 2$ µm to $\leq 5$ µm. Also to be preferred, the bioparticles have a size of average diameter in the range of $\geq 0.5$ µm to $\leq 2$ µm, more preferably in the range of $\geq 1$ µm to $\leq 2$ µm. One advantage of the disclosure may be that small microorganisms or cells can be isolated and cultivated in a stream in such a way. One advantage of the disclosure may be represented whereby a contactless cultivation of single microorganisms or cells smaller than 5 µm can be made available in microstreams.

It may be particularly preferred to carry out one embodiment of the method of the disclosure in a microfluidic system where the microchannel structure has a depth<20 µm, preferably in the range of $\geq 2$ µm to $\leq 20$ µm, more preferably in the range from $\geq 2$ µm to $\leq 10$ µm, most preferably in the range of $\geq 2$ µm to $\leq 5$ µm. In a range of $\geq 2$ µm to $\leq 20$ µm, a particularly good manipulation, particularly of bacteria and other microorganisms or smaller cells with a size of 0.5 µm to 5 µm, is possible.

It may be particularly preferred that the distances of the electrodes installed on the substrate in a plane be in the range of $\geq 2$ µm to $\leq 20$ µm, more preferably in the range from $\geq 2$ µm to $\leq 10$ µm, most preferably in the range from $\geq 2$ µm to $\leq 5$ µm.

In preferred embodiments, the separated bioparticles can be led away alive after study, observation and/or manipulation for propagation in a population. One embodiment of the method of the disclosure enables the removal of analyzed single living microorganisms or single cells in order to be able to enlist them again for a population in biotechnological processes in an advantageous manner, for example.

A further subject matter of the disclosure concerns a microfluidic system, in particular a flow cell, for the dielectrophoretic separation of polarizable bioparticles like cells and/or cell organelles, comprising a microchannel structure with the following parts:
  a preseparation chamber, wherein the preseparation chamber has a first feed line for delivery of a fluid containing the polarizable bioparticles and a first drain for leading away at least a part of the fluid containing the polarizable bioparticles;
  a separation chamber, wherein a feed line opening out of the preseparation chamber connects the separation chamber with the preseparation chamber;
  a second drain for the optional removal of fluid containing other polarizable and/or non-polarizable bioparticles, that opens out of the separation chamber;

a cultivation chamber, wherein a feed line opening out of the separation chamber connects the cultivation chamber with the separation chamber;

a third drain opening out of the cultivation chamber for removal of the analytes;

a second feed line for delivery of a fluid wherein the second feed line opens into the separation chamber or the cultivation chamber.

In one advantageous manner, the structure of the microchannels allows for isolation of smaller single cells, for example with a size or an average diameter of ≤5 μm, particularly in the range of ≥0.5 μm to 5 μm, leading them into a cultivation chamber to cultivate them there specifically contactlessly in a stream over a longer time period, as well as to take samples of living cells and to be able to pump them alive again from the chip, for example, into a cultivation vessel.

In preferred embodiments, the method of the disclosure for the separation of a polarizable bioparticle can be carried out by a microfluidic system according to the disclosure.

Particularly advantageous may be the drain of the analytes opening out of the cultivation chamber. This drain allows the analytes to be removed from the chip into measuring stations, for example.

Preferably the drain, which opens out of the separation chamber, can open into the preseparation chamber or its removal area again for the optional removal of a fluid containing another polarizable bioparticle. This embodiment can save a fluid connection for the chip. This may have the advantage that the split ration of the fluid stream remains constant in the preseparation chamber and does not have to be disadvantageously suspended for any restructuring because of contact with peripheral fluid.

Preferably, the second feed line for delivery of fluid opens into the separation chamber. Preferably, the second feed line for delivery of fluid into the separation chamber crosses the feed line out of the preseparation chamber and the second drain opening out of the separation chamber for the optional removal of a fluid containing another polarizable bioparticle, so that the separation chamber preferably lies in a crossing of microchannels.

Through the introduction of the cells through the one channel and the flushing with fluid, particularly analyte medium, of the single cell caught by the octupole in the crossing area from the crossing channel, the use of a cross channel advantageously may allow the single cell to be analyzed in isolation.

It may be particularly advantageous if the cultivation chamber does not lie in a linear extension of the microchannel in which the separation takes place. Preferably, the cultivation chamber lies in a microchannel that lies in an angle, for example essentially a right angle, to the microchannel in which the separation takes place. In this way, contamination by secreted substances of foreign cells and cell remains is further reduced.

Particularly, samples of single microorganisms, living and cultivated under defined conditions, can be captured with the medium or directly analyzed in one advantageous manner through isolation and cultivation at a minimal distance to the analysis exit and channel structuring free of dead volume.

It may be particularly advantageous to provide an additional feed line to the cultivation chamber. This enables us to delivery the bioparticle with a pump of larger delivery volume into cultivation vessels outside of the microfluidic system via an additional drain from the cultivation chamber.

In preferred embodiments, the microchannel structures have a depth of <20 μm, preferably in the range of ≥2 μm to ≤20 μm, more preferably in the range of ≥2 μm to ≤10 μm, and most preferably in the range of ≥2 μm to ≤5 μm.

Advantageously flat electrode structures in microfluidic chips, particularly with nDEP technology, may allow a very stable, contactless isolation and cultivation of single microorganisms in microstreams. A reduction of the channel height and at the same time reduction of the electrode distance, which has a quadratic influence on the nDEP force effect, may allow an improvement of the holding force in relation to the polarizable bioparticle. The exact adjustment of the microchannel height in the dimensional range of the classic size distribution of microorganisms allows a very precise adjustment of electrode distances in multicomponent systems with electrodes. Through precise adjustment of the distances in fabrication, the nDEP force effect on bioparticles such as microorganisms can be optimized. This advantageously may enable the manipulation of bacteria or smaller cells of a size or a mean diameter of ≤5 μm, particularly in the range from ≥0.5 μm to ≤5 μm.

A further advantage of a lower channel height of the microchannel structure may be that a smaller fluid volume is exposed to a field whereby a slighter or negligible warming occurs in the electrical AC field. This allows the use of an essentially higher electrical AC field intensity and thus essentially improved repulsion with the negative dielectrophoretic AC field because of negligible warming. The improved force effect can make new possibilities of manipulation available such as the holding of very small cell types like bacteria in microstreams.

The width of the microchannels is preferably in the range of ≥50 μm to ≤1 mm, more preferably in the range of ≥100 μm to ≤800 μm and most preferably in the range of ≥200 μm to ≤700 μm. The essentially wider than high channels enable an essentially better nDEP manipulation by better fluidic control through lighter to enhancing laminar fluid volume streams. In this way, an only 0.5 μm large polarizable biomolecule or cell captured in the nDEP field cage can be bathed and supplied with medium contactlessly, free from pressure variation and stably. Further, a width of the microchannels in the range of ≥100 μm to ≤300 μm, particularly ca. 200 μm, is to be preferred. This width of the microchannels enables a good fluidic control.

In comparison to the microchannels the cultivation chamber is preferably widened in a ratio from 1.5:1 to 10:1, more preferably 7 times wider, as the width of the microchannels. This enables a quicker transport in connected channels and a more stable nDEP manipulation of the polarizable biomolecules in the cultivation chamber. Through the widening of the microchannels, the medium flow is decelerated. This can systematically be carried out at the electrodes for nDEP manipulation and enables us to use lower voltages, for example by holding the very small cells in the field cage. In this way, manipulation of only 0.5 μm large cells can be achieved in a voltage area not invasive for the cell.

Likewise, in comparison to the microchannels the separation chamber is preferably widened in a ratio of 1.5:1 to 10:1, more preferably 7 times wider than the width of the microchannels. The separation chamber has preferably a width of at least 400 μm. It is especially preferable that the separation chamber lies in an enlargement, or a widened area, of a channel or better in a crossing of microchannels. In particular, the separation chamber lies preferably not in a normal linear, narrow area of the microchannels. This has the effect that the flow force of the fluid in the area of the separation chamber is reduced.

If the separation chamber is in a crossing of the microchannels, the channel crossing of the separation chamber is preferably formed as small as possible. In particular, it is preferred if the side lengths of the crossing are ca. 200 µm. With the use of an octupole electrode configuration, it is preferred that the electrodes of the octupoles lie as exactly as possible on the crossing point of the channels that form the separation chamber. It is more preferable that the electrodes be guided upon the edges of the supply and drains. It is even more preferable that the electrodes be merely isolated on the edges, wherein the exposure of the isolation of the electrodes already on the corners of the crossing begins. This may have the advantage that a good force field can be formed.

Preferably, the channel that connects the cultivation chamber with the separation chamber into which the polarizable bioparticle is to be separated, or the feed line opening out from the separation chamber into the cultivation chamber, is at least 2 times smaller than the feed channel and exit channel for removing the particles that are not being separated. Alternatively, it is preferable that the width of the microchannel opening into the separation chamber correspond to the width of the feed line opening out of the separation chamber into the cultivation chamber, and for example is about 200 µm.

The distances between the preseparation chamber and the separation chamber are variable. Preferred is a distance between the preseparation chamber and separation chamber or a length of the feed line opening out of the preseparation chamber, which connects the separation chamber with the preseparation chamber, of at least ca. 50 µm. This may have the advantage of guaranteeing that electrodes with different force field functions do not affect one another and the functions of the force fields are not disturbed.

Suitable electrode and/or pump arrangements are used depending on the desired fluid flows.

Preferred electrode arrangements comprise, in particular, suitable electrode arrangements for producing a dielectrophoretic field cage as well as electrode arrangements for removing the bioparticles. Preferably, a dielectrophoretic field cage is set up in the separation chamber and/or the cultivation chamber. In the preseparation chamber, a deflecting electrode can be set up.

In preferred embodiments, the angle of the deflecting electrode lies as steep as possible, thus small, to the angle of the flow direction. This simplifies the deflection of the bioparticles.

The distances of the electrodes for capturing ca. 2 µm to 5 µm large bioparticles is preferably at most 20 µm, more preferably in the range from ≥10µ to ≤15 µm. The distances of the electrodes for capturing ca. 0.5 µm to 2 µm large bioparticles is preferably at most 15µ, more preferably in the range of ≥5 µm to ≤12 µm.

Preferably, a dielectrophoretic field cage is formed in the separation chamber and/or in the cultivation chamber in order to trap a separated bioparticle. More preferably, a dielectrophoretic field cage is formed in the separation chamber and the cultivation chamber. Further, a dielectrophoretic field cage can be formed in the preseparation chamber.

The distance between the electrodes of the field cage preferably corresponds to the channel height. More preferably, the distance of the electrodes of the field cage is at least ca. three times larger than the diameter of the bioparticle to be separated. Preferably, for the separation of bioparticles of a size from 0.5 µm to 5 µm, the distance of the electrodes of the field cage lies in the range of 2 µm to at least 15 µm, preferably a maximum at 50 µm. For the separation of platelets, the distance of the electrodes of the field cage can lie in the range, as an example, of ≥16 µm to ≤18 µm, and for separation of about 15 µm large cancer cells at 40 µm.

Preferably, a dielectrophoretic field cage is formed by an octupole electrode whereby a partial exposure of the passivation of the inner octupole electrodes forms a shielding nDEP force field around the exposed electrodes.

In preferred embodiments, the distance between the electrodes of the field cage, in particular an octupole electrode arrangement, is in the range of ≥10 µm to ≤20 µm. With an alternating current of 0.1 V to 4 V, for negative dielectrophoresis smaller electrode distances can not only cause a many times higher deflecting force but also an essentially reduced resistive heating of the fluid between the electrodes. One advantage may be that heat generation can be negligibly small by means of the resistive heat in this manner. This enables us to overcome the disadvantage of resistive heating (Eng. Joule heating) of the negative dielectrophoresis. Further, in this way, a very stable deflection and very stable capture of the bioparticle can be guaranteed even with quicker flows.

In one advantageous manner, with the distance between the electrodes of 20 µm of an octupole geometry, cells with a size between 0.5 µm and 20 µm can be systematically captured and manipulated, for example, industrially relevant, yeasts and bacteria, as well as cell organelles such as mitochondria.

Moreover, cell interactions with small cells can be measured. For example, it is possible to guide two, three or more cells systematically together and to make contact or be pressed upon each other. The contactless manipulation by the force field prevents the influence of substrates so that the isolated contact of the cells can be analyzed. Afterwards, the cells can be separated again systematically. For example, human kidney cells with bacteria or single red blood cells could be guided together with a single thrombocyte and be separated again. In this way, daughter cells of a growing cell can be separated systematically.

The electrodes further enable a temperature change in the range of milliseconds whereby the effect of rapid temperature changes on biological systems can be studied.

One embodiment of the method of the disclosure as well microfluidic system thus enable a control over the microenvironment of bioparticles that is central for biological research, since it allows the study of the change of a single particle on a biological system and thus may clearly improve the study of the causes of cell response.

The microfluidic system can particularly be produced by microtechnological methods. As an example, a substrate structured particularly by stamping or etching, for example a glass substrate, a silicon substrate or a biocompatible polymer substrate can be used. Then electrodes can be placed on the substrate by means thin-film technology and/or lithography, for example. After that, the resulting system can be covered with a cover, for example with a glass plate or a polymer plate.

In one advantageous manner, glasses are biocompatible. Borosilicate glasses and quartz glasses are preferred. Borosilicate glasses are very well suited as they are mechanically and chemically very stable against temperature. Quartz glasses have good refraction properties.

This may be particularly advantageous for optical analyses. Of polymers cyclo-olefin copolymers (COC) may be particularly well suited. Cycloolefin copolymers may be advantageously biocompatible, chemically very resistant, thermally resistant, have very good mechanical properties and a very slight double refraction. In addition Cycloolefin copolymers may be a very convenient material. Chemical, mechanical and thermal resistance may be particularly advantageous for cleaning and sterilization of the microchips.

Another subject matter of the disclosure relates to a method for producing a microfluidic system according to the disclosure wherein cover of the microfluidic system is attached by means of a biocompatible photoresist varnish, particularly on an epoxide resin basis.

In the context of the present disclosure, the concept "biocompatible" is understood as photoresist varnish free of adhesive and/or softeners. It is particularly to be preferred that no substances affecting bioparticles, particularly no adhesive and softeners, are deposited from the photoresist varnish on to the fluid. Particularly, adhesives or polymers often deposit additives that can considerably affect cell physiology and associated sensitive trace analysis.

A preferred photoresist varnish on an epoxide resin basis is SU-8 Negative photoresist varnish, for example available from the Microchem Corp. SU-8 Negative photoresist varnish is particularly biocompatible. A more preferred photoresist varnish is the AZ® nLof 2070 Fotolack, available from MicroChemicals GmbH, for example. Even more preferable photoresist varnishes are varnishes chosen from the Megaposit™ SPR™ i-Line photoresist product line, available from MEGAPOSIT, MICROPOSIT, MF, Shipley Company, L.L.C. Other preferred photoresist varnishes are chosen from the ma-N 400 and ma-N 1400 Negative photoresist product series, available from Micro Resist Technology GmbH.

Photoresist varnishes with positive or negative exposure properties can be structured by means of photolithographic methods. This allows a connection of the covering of the microfluidic system without having an adhesive leading to more elevation of the channels. The use of a photoresist varnish especially allows a depth of the microchannel structures of <20 μm. Through a defined spinning and lithographing, particularly of the varnish applied for the first hardening step, the depth of the channels can be set advantageously in a range between 2 μm and 20 μm with a precision of +/−0.1 μm.

In preferred embodiments, the photoresist varnish is put on during the production of the microfluidic system in other microchannels, that, in particular, lie parallel to the channels for the fluid of the microfluidic system. This can take place by lithographing of a second channel structure in photo varnish. Preferably, the other microchannels constructed on both sides from the fluid channels exist later in the microfluidic system. In particular, these can completely run around the later fluidic channels.

These additional channels can be filled with photoresist varnish. When aligning the cover glass by capillary action, through preferred light overdosing the varnish can be likewise drawn into the cracks. Microscopic dead volumes to a larger channel volume can thereby be filled.

The capped chip is preferably exposed to hardening of the liquid varnish. This enables connection or adhesion without the usual adhesives. In particular, it may be advantageous that varnish in contrast to an adhesive contributes only negligibly thin layers to the channel height so that this allows a very small depth of the channels to be produced. The use of a photoresist varnish especially allows a depth of the microchannel structure of <20 μm.

Overflow channels that are particularly directed away from the microfluidic channel structure can be provided to be installed in the other microchannels. This enables a lighter dosing of varnish without the later microfluidic channels becoming contaminated, since excess photo varnish can flow away.

The disclosure further relates to the use of a microfluidic system according to the disclosure in an integrated microfluidic lab-on-a-chip system.

In particular, a microfluidic system according to one embodiment of the disclosure can, for example in an integrated microfluidic lab-on-a-chip system, be used in medical technology and microbiology, in medical analysis, for example. Moreover a microfluidic system according to the disclosure, for example in an integrated lab-on-a-chip system, can be used in biotechnology for the development of product strains. In particular, a microfluidic system according to one embodiment of the disclosure can be used for the analysis of cancer cells or germs. The disclosure has special significance especially for future developments of synthetic biology. Since one cell represents the minimal functional unit of life, this provides direct genome/function relationships without a mix of biomolecules to be analyzed as in experiments on a population basis.

Especially, a microfluidic system according to one embodiment of the disclosure can be used for metabolic analysis with isotopomer-marked media components in order to carry out a systematic cell strain optimization. Thus, metabolic pathways can be identified by defined single cell manipulations which, for example, have an influence on the yield or selectivity of the biotechnological process. In particular, a microfluidic system according to one embodiment of the disclosure can be used for lysis and isolation of DNA or other cell components of a single cell. Further, a microfluidic system of one embodiment of the disclosure can also be used in order to introduce molecules, such as biomolecules, e.g. non-invasive DNA, into separated single cells and then let them grow in a population for a biotechnological process, for example.

Further, a microfluidic system of one embodiment of the disclosure can be used for systematic differentiation and associated analysis of embryonic of adult stem cells.

The microfluidic cell can, in particular, be integrated into a microfluidic chip. Another subject matter of the disclosure relates to a chip comprising a microfluidic system of the disclosure.

In particular, the microfluidic system can be integrated into a microchip periphery for activating electronics, fluids, guiding bioparticles in and out and/or regulation of temperature.

Examples and figures that serve to illustrate the present disclosure are given below. Embodiments of the disclosure are represented in the drawing and will be explained more closely in the following description.

FIGS. 1 to 3 show schematic views of the essential step of dielectrophoretic preseparation, fluidic separation and study of the separated bioparticle according to the method of the disclosure. Further, FIG. 5 shows schematic cross-sectional views of the essential production steps of the method for producing a microfluidic system of the disclosure.

DETAILED DESCRIPTION

Figure 1:
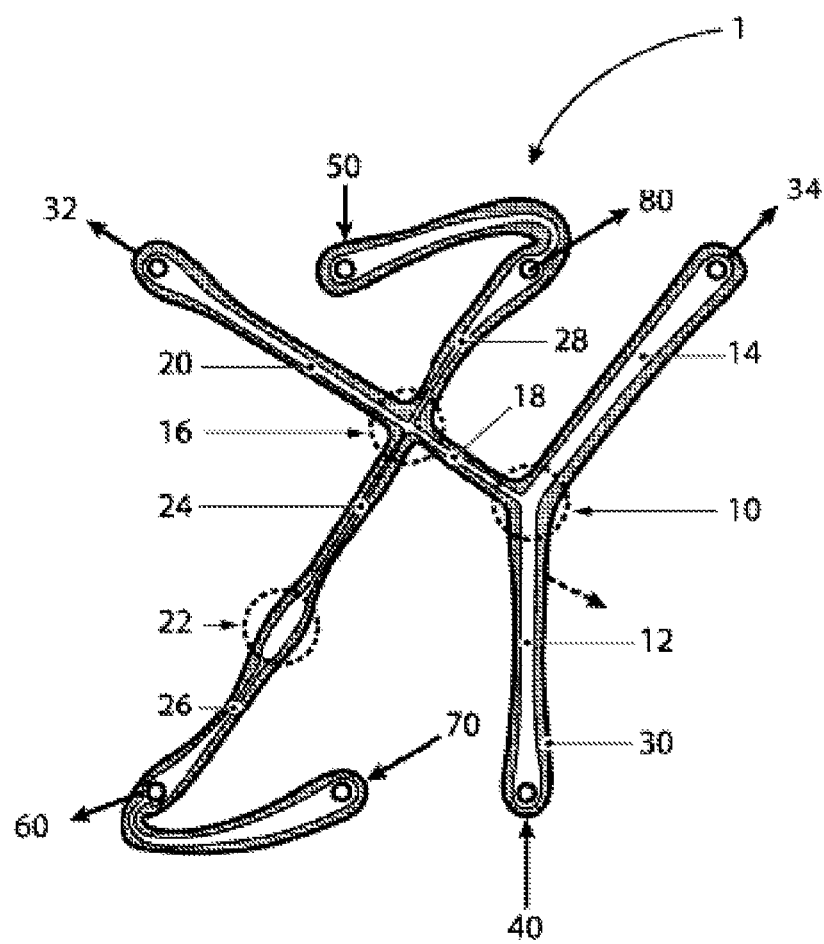
FIG. 1 shows an exemplary embodiment of the microchannel structure of a microfluidic system.

FIG. 1 shows an exemplary embodiment of the microchannel structure of the microfluidic system 1. A preseparation chamber 10 has a first feed line 12 for delivery of a fluid containing the polarizable bioparticles and a first drain 14 for removing at least a part of the fluid containing the polarizable bioparticles. A separation chamber 16 is connected with the preseparation chamber 10 by a feed line 18 opening out of the preseparation chamber 10. A second drain 20 for the optimal removal of fluid containing other polarizable bioparticles opens out of the separation chamber 16. A cultivation chamber 22 is connected with the separation chamber 16 by a feed line 24 opening out of the separation chamber 16. A drain 26 opening out of the cultivation line 22 serves for removing the analyte. A feed line 28, that opens into the separation chamber 16, can serve for delivering a fluid.

The outer structure 30 shows, by example, a channel structure before connection of the chip plates with varnish. An exposure step enables the connection of the channel structure with a cover glass so that the adhesives with their own height can be avoided and very flat, less than <20 μm high canals can be achieved even with multi-component chips; they will enable stable manipulation of microorganisms or smaller single cells of a size of 0.5 μm to 5 μm with nDEP chips.

In a first pump mode to begin with, cells can be continuously pumped into the entrance 40. In the preseparation chamber 10, a cell can be isolated and in a separation chamber 16 it can be trapped in a field cage, for example. Cell-free medium can then be delivered through the entrance 40 in order to remove other cells from the chip. Then, a second pump mode can be activated and medium pumped into the entrance 50 in order to cultivate and analyze the single cell to be studied in a field cage or hook electrode in the cultivation chamber 22 near the analysis exit 60. In the cultivation chamber, the temperature and composition of the medium can be varied through the entrance 50 for perturbation analysis. Besides possible optical-based analyses, fluorescence etc., for example, single cell samples can be collected during cultivation by the exit 60 and analyzed. Then, a third pump mode can be activated that can pump the single cell by introducing medium in the entrance 70 through the exit 80 in order to guide it into a cultivation vessel. Subsequently, new cells can be introduced into the chip through the entrance 40 for the next analysis.

In another preferred embodiment of the microchannel structure, the drains 14 and 20 to the exits 32 and 34 can be joined to a common exit. This may have the advantage that the split ratio of the fluid stream remains constant in the preseparation chamber. Further, this embodiment can save a fluid connection for the chip.

Dielectrophoretic Preseparation

Figure 2:
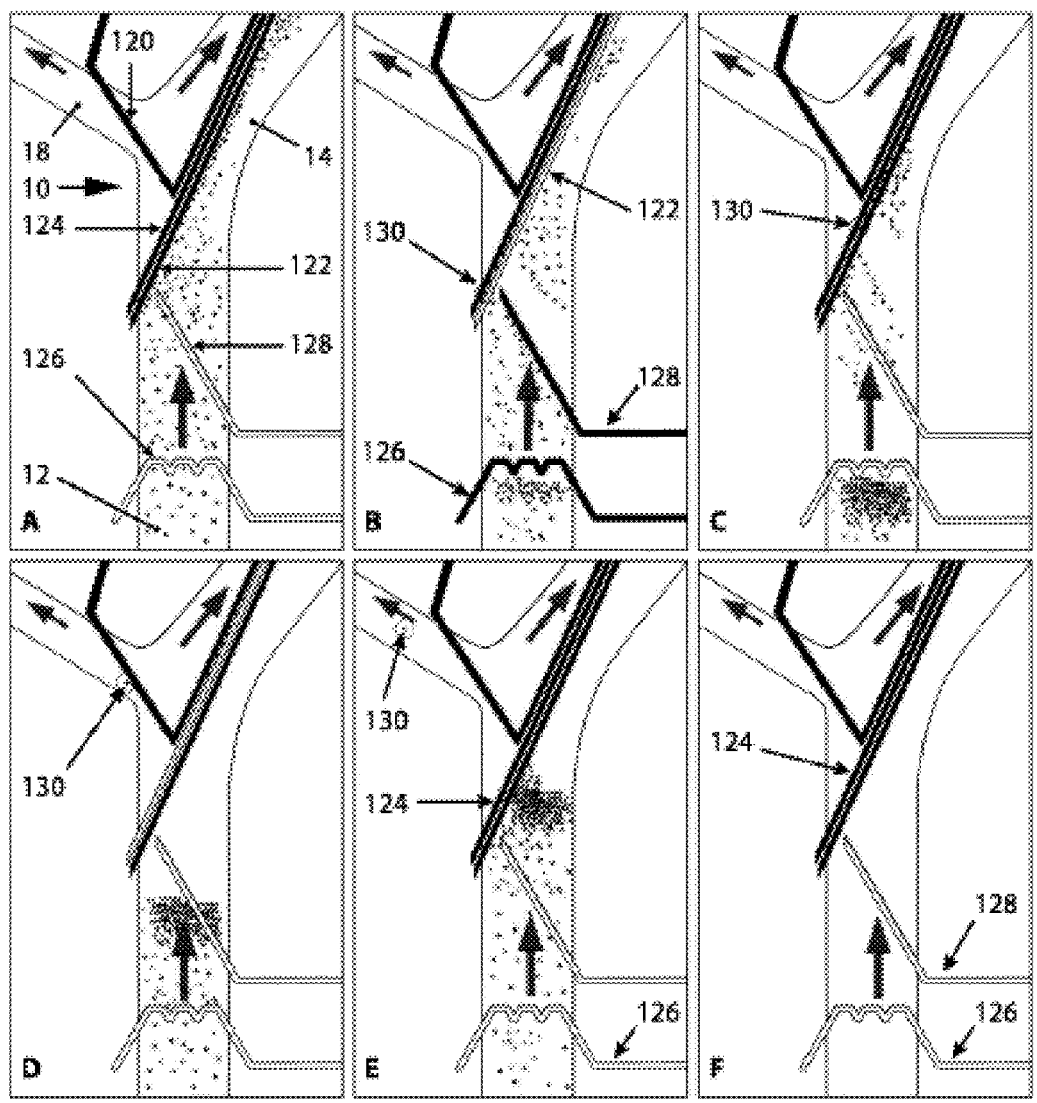
FIG. 2 represents the method step of dielectrophoretic preseparation of a polarizable bioparticle

FIG. 2 illustrates the method step of dielectrophoretic preseparation of single sells from a cell solution, e.g. from a bioprocess reactor. After a cell suspension was introduced into a first feed line 12, a so-called fence electrode 120, gate 1 electrode 122 and gate 2 electrode 124, as seen in FIG. 2A, were triggered to prevent other than the selected cell from being able to flow into the feed line 18 opening out of the preseparation chamber 10 to the separation chamber. Both gate electrodes 122 and 124 were activated with different frequencies. For the separation of a selected cell 130, the barrier electrode 126 and deflection electrode 128 were switched on. In this way, the following cells were held back and the selected cell 130 was directed into the flow profile area for single cell separation, as seen in FIG. 2B. The gate 1 electrode 122 would be switched off. In this way, several cells were deflected at the gate 2 electrode 124. As seen in FIG. 2C, the gate 1 electrode 122 was switched on again to deflect following cells after the selected cell 130 had passed the gate 1 electrode. As seen in FIG. 2D, the selected cell 130 was thus the last cell in the flow and was deflected up to the tip of the fence electrode 120 where the gate 2 electrode 124 was switched off to guide the selected cell 130 from the preseparation 10 through the feed line 18 opening out into the separation chamber 16. With the switching on of the gate 2 electrode 124 again, the barrier electrode 126 was automatically switched off, as seen in FIG. 2E. FIG. 2F shows that, after the cell 130 was fixed in a dielectrophoretic field cage in the separation chamber 16, fresh medium was supplied to remove all other cells from the chip.

In an alternative embodiment, the gate electrode 124 could be designed to reach into the drain 14 in the length only over the tip of the fence electrode 120. Advantageously, with this length, a secure drain of the cell may be ensured. In another embodiment, it could be provided that the fence electrode 120 was realized after the formation of the hook-shaped tip not led through in the direction of the drain 14, but merely forming a hook nose.

Further, the hook-shaped tip of the fence electrode 120 could be designed to be formed with the smallest possible electrode surface, for example with an electrode width of 10 μm, preferably 8 μm. It could be established that this width was sufficient for a good deflection. Advantageously, a reduction of the contact surface may achieve an improvement of deflection. Furthermore, the smallest possible non-insulated electrode contact surfaces could be designed. And then, the insulation of the fence electrode 120 could be designed to reach only a little over the entrance area of the electrode 120 in the microchannel.

In a another alternative embodiment it can be provided that the method step of dielectrophoretic preseparation is not carried out through the deflection configuration of the electrodes 120, 122, 124, 128, but by means of an octupole electrode with a dielectrophoretic field cage.

Fluidic Separation of a Single Cell

Figure 3:
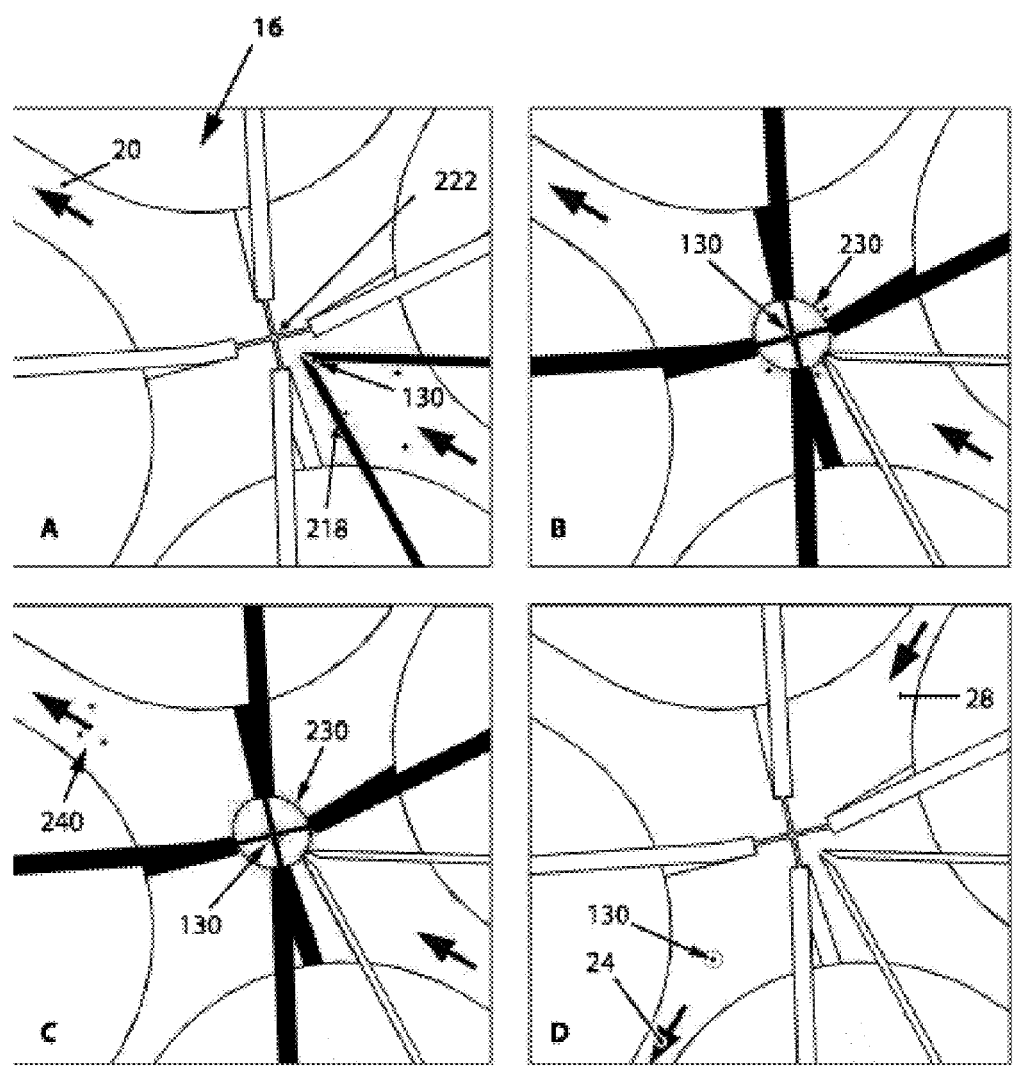
FIG. 3 represents the method step of fluidic separation of the selected bioparticle.

FIG. 3 illustrates the method step of fluidic separation of the selected cell by fixing the cell in a first dielectrophoretic field cage and circulating fluid around it.

After preseparation, FIG. 3A shows the selected single cell 130 deflected to the center 222 of the field cage by funnel electrodes 218. After passage of the funnel electrodes 218 and the presence of the cell 130 in the center 222 of the octupole, the first dielectrophoretic field cage 230 was switched on so that the cell was held in the flow by the nDEP force field, as FIG. 3B shows. By switching on the first dielectrophoretic field cage 230, the funnel electrodes 218 are automatically deactivated. Through a partial exposure of the insulation clinging to the electrodes, particularly a glass coating, a spherical force field 230 arose around the exposed electrodes which prevented that it would possibly be captured with cells separated in the preseparation. The following cells are deflected around the octupole field cage 230 and were flushed from the chip, as FIG. 3C shows, from the drain 20 that opens out of the separation chamber for the optional removal of other polarizable cells. After the isolation of the selected cells, these were transferred into the cultivation chamber, as FIG. 3D shows, upon activation of a suitable pump mode and switch off of the first dielectrophoretic field cage by introducing fresh medium via a feed line 28, that opens into the separation chamber 16, through a feed line 24 opening out of the separation chamber 16.

In an alternative embodiment, the feed line 18 to the separation chamber can have a width of about 200 μm like the drain 24. Advantageously, the channel crossing of the separation chamber may be made as small as possible. It is particularly preferred if the side lengths of the crossing are ca. 200 μm. In particular, it is preferred that the electrodes of the octupole lie as exactly as possible on the crossing point of the channels that form the separation chamber. It is more preferable that the electrodes are put on the edges of the feed and drain lines. It is most preferable that the electrodes merely are insulated on the edges whereby the exposure of the insulation of the electrodes begins already at the corners of the crossing. This may act advantageously to be able to form a good force field 230, which allows a separation without the funnel electrodes 218 being enabled.

Cultivation and Perturbation of a Single Cell

Figure 4:
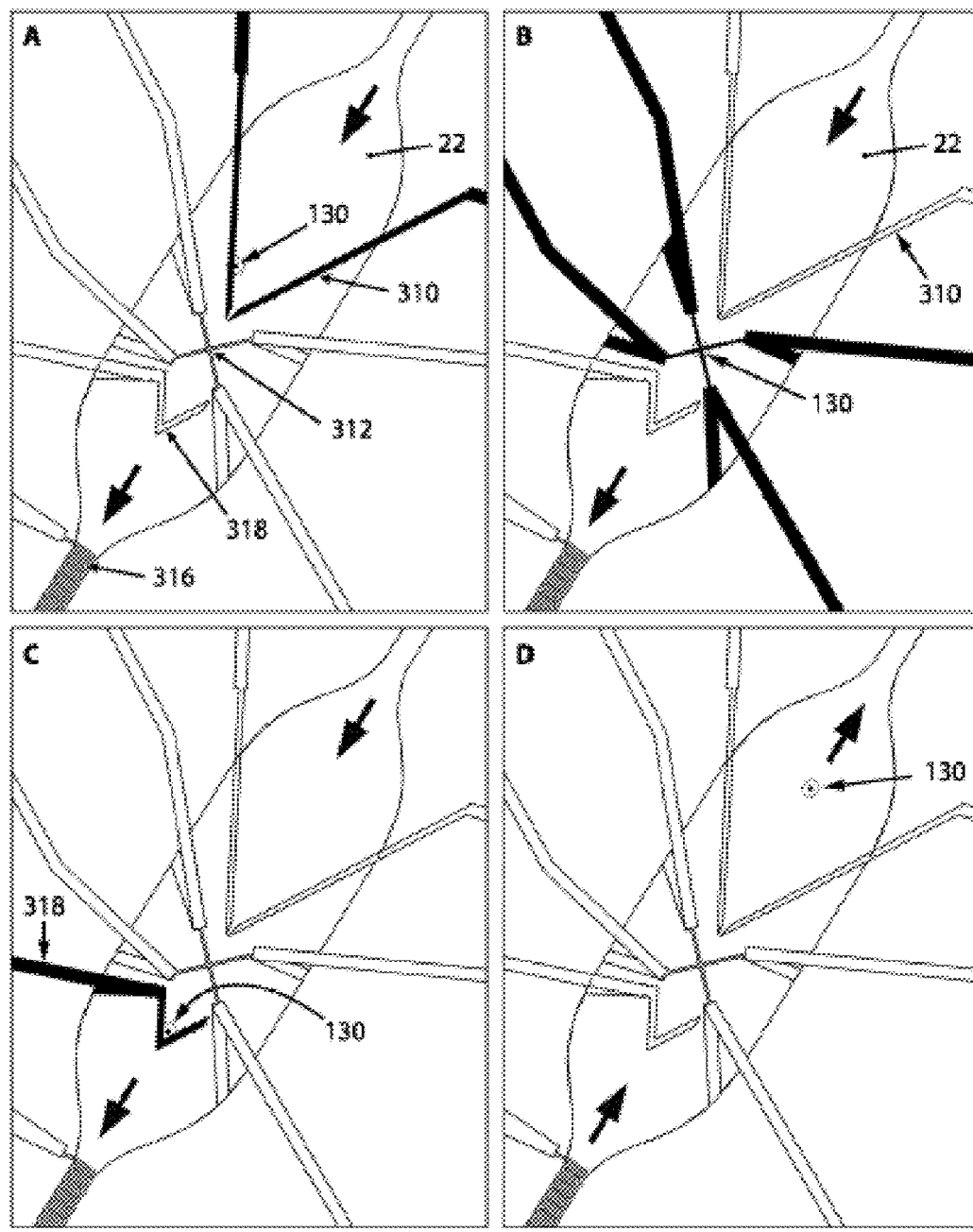
FIG. 4 represents the method step of the study of the separated particle.

After introducing the cell 130 into the cultivation chamber 22, as shown in FIG. 4A, the single cell 130 with funnel electrodes 310 on the center 312 of an octupole was delivered, as shown in FIG. 4B, and directed with a specific field mode and voltage in order to cultivate and analyze the cell in a second dielectrophoretic field cage. The temperature during cultivation was measured by a resistance sensor 316. Alternatively, the cell can be cultivated, perturbed and analyzed without contact in a hook electrode 318 with the aid of the microflow, as shown in FIG. 4C. After optical or non-optical analyses another pump mode was activated and the cell, as shown in FIG. 4D, was released live into a cultivation vessel for propagation in a population.

Figure 5:
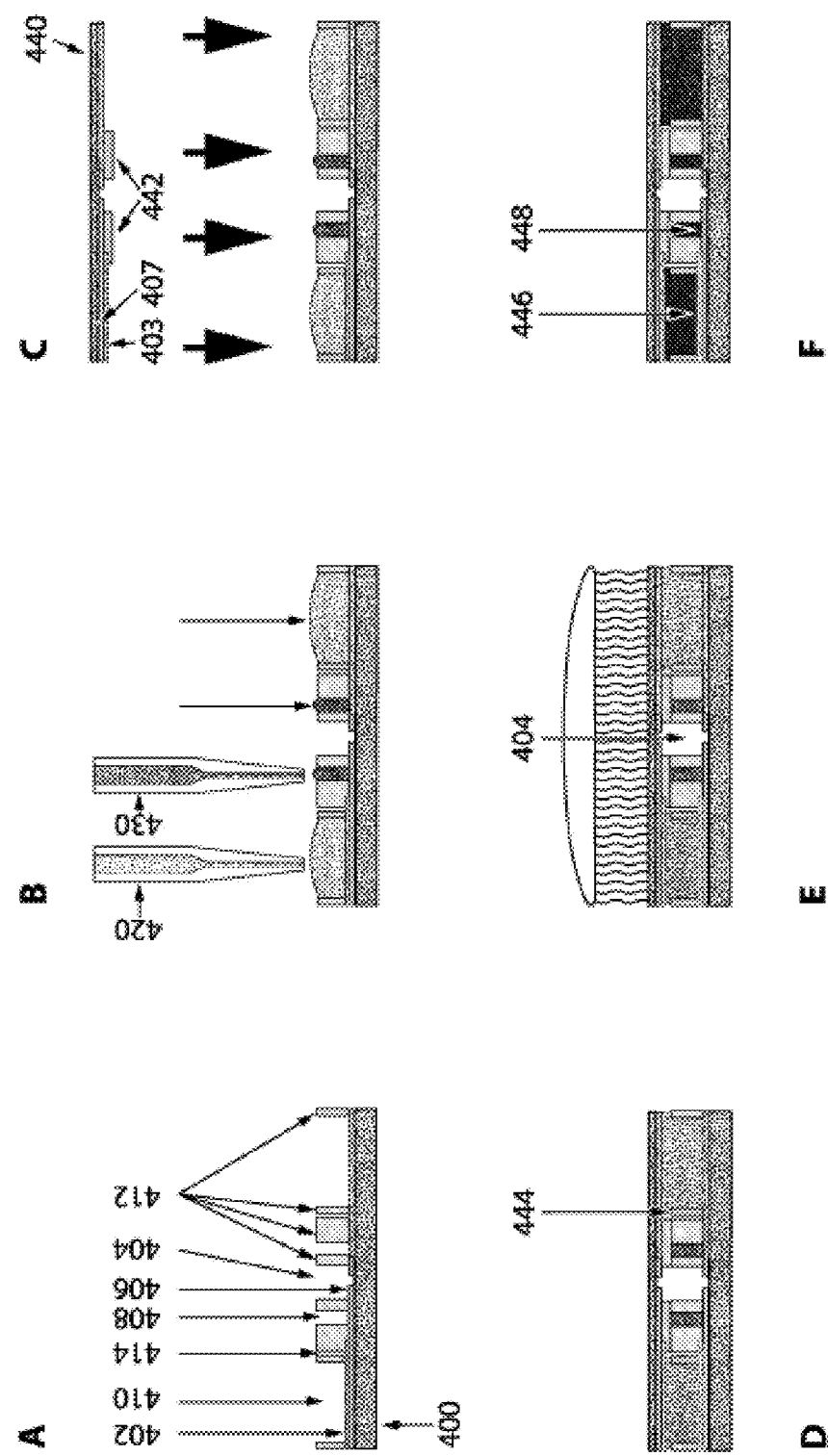
FIG. 5 shows schematic cross-sectional views of the production steps of the method for producing a microfluidic system.

FIG. 5 shows a schematic cross-sectional view of the production steps for producing a microfluidic system.

FIG. 5A shows a prefabricated, uncovered chip structure with a glass substrate 400, glass insulation 402, a microfluidic channel 404, electrodes 406, and reservoir 408 for the biocompatible photoresist varnish, a loading chamber 410 for biocompatible or non-biocompatible varnish or adhesive 420 as well as a spacer 412. For further adhesive optimization of the upper cover glass, the loading chamber 410 can be filled, not compulsorily, with biocompatible photoresist varnish and additionally serves for further mechanical strengthening of the chip resulting from the manufacture. The spacers 412 and 442 can be used for the setup of the microfluidic channel depth. This enables a spinning defined above with defined varnish viscosity and flow properties. The spacer 412, like spacer 442, can preferably be made from biocompatible photoresist varnish. A second channel structure 414 can be created around the microchannel structure 408 for the fluid as overflow reservoir for the biocompatible varnish 430, for example through lithography, as FIG. 5A. In preferred embodiments, overflow channels for the photo varnish are provided between the reservoir 408 and the channel 414. This enables excess photo varnish to flow away without contaminating the microfluidic channels 404. The channel structure 408 surrounding the microfluidic channels 404 can be filled with biocompatible photoresist varnish 430, particularly of an epoxide resin base such as SU-8, as shown in FIG. 5B. The loading chamber 410 can be filled with non-biocompatible or biocompatible varnish 420.

FIG. 5C shows the positioning of a cover glass 440 with upper isolation 403, upper electrode 407 and spacer 442 put on the cover glass. The spacer 442 is placer on the lower spacer 412 and can serve likewise for channel depth adjustment. After positioning and placement of the cover glass 440, the biocompatible photoresist varnish 430 is drawn from the reservoir microchannel by capillary action and seals the microfluid channel. With a light overdosing the varnish can likewise be drawn into the cracks and thus fill in microscopic dead volumes up to larger channel volumes when aligning the cover glass through capillary action, as shown in FIG. 5D. FIG. 5E shows the exposure of the covered chip and the hardening of the liquid varnish. Preferably, the exposed chip is warmed to a temperature suitable for the varnish. Preferably, the lower spacer 412 is formed by the photo varnish that is used to join the chip structure with the cover glass 440. By using photoresist varnish 430, adhesion is made possible without usual adhesives. The spacer height is the only spacer between the electrodes in this embodiment. The distance of the electrodes can thus be adjusted with a layer thickness to a +/−0.1 μm precision and allows a very small distance of less than 20 μm, preferably of at least 2 μm. This is, as an example, dependent on the viscosity of the varnish and the rpm used when spinning the varnish. In a range of ≥2 μm to ≤20 μm, a particularly good manipulation especially of bacteria and other microorganisms or smaller cells with a size of 0.5 μm to 5 μm is possible by means of negative dielectrophoresis. The dosing of varnish is dependent on the existing channel structure.

Figure 6:
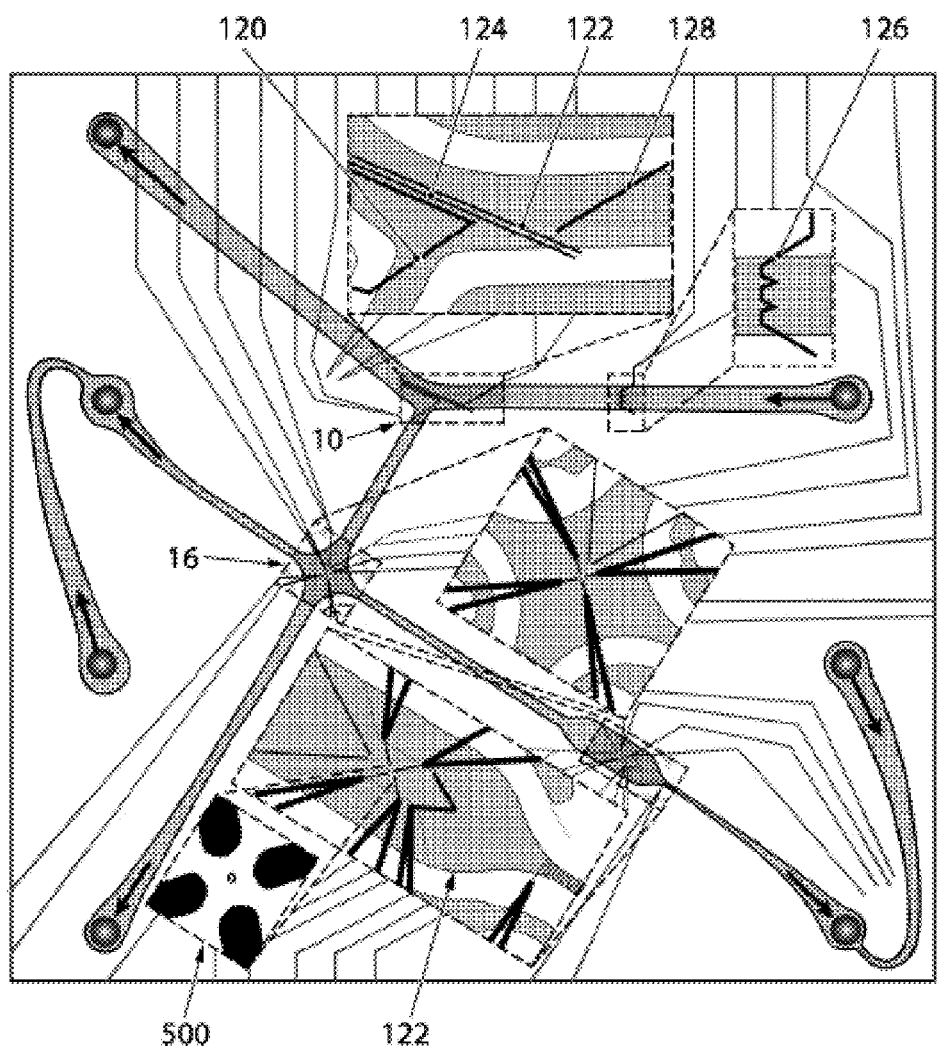
FIG. 6 shows an exemplary chip design.

FIG. 6 shows an example of chip design. A microscope photo of a barrier electrode 126, arrangement of fence electrode 120, gate 1 electrode 122, gate 2 electrode 124 and deflecting electrode 128 in the preseparation chamber 10 are shown enlarged, likewise an octupole and funnel electrode in a separation chamber 16, and an arrangement of a funnel electrode, another octupole and a hook electrode in a cultivation chamber 122. Likewise, an enlarged photo 500 of a *Corynebacterium glutamicum* cell cultivated in the center of the octupole and dividing is shown.

Figure 7:
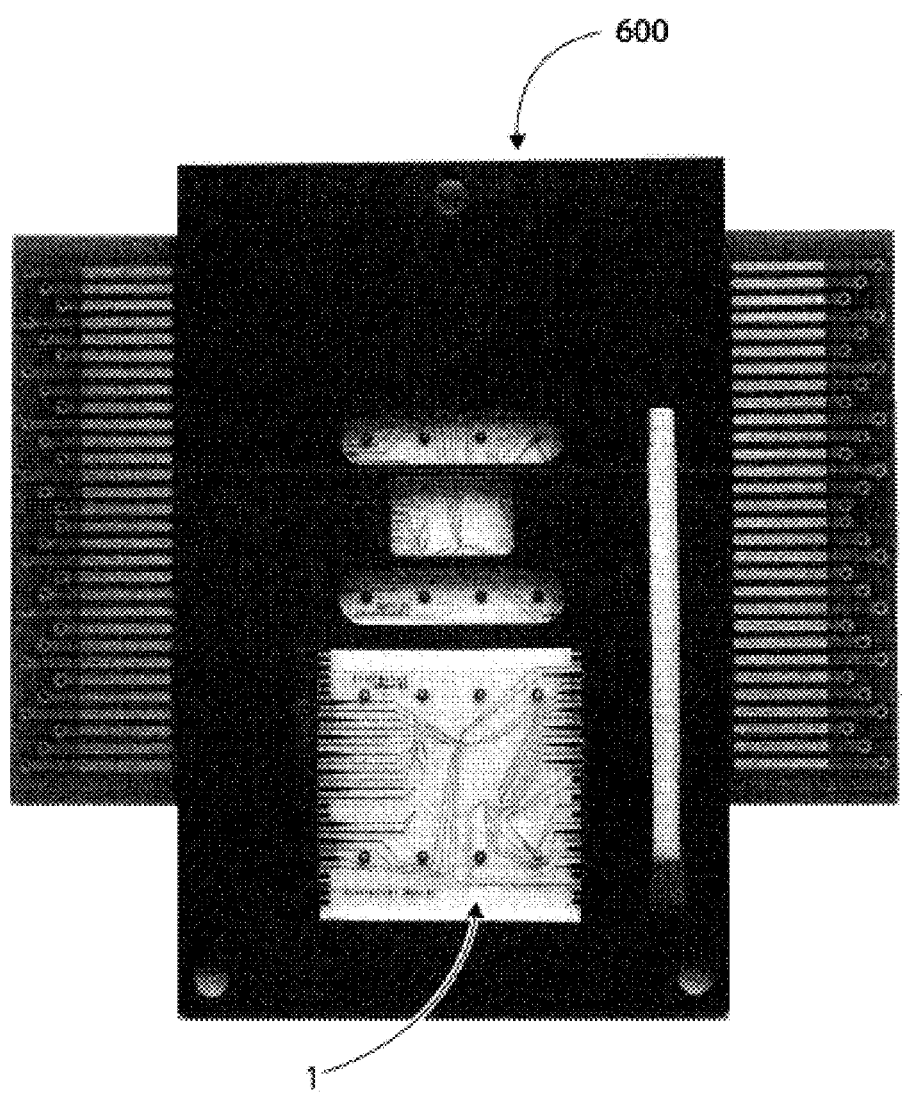
FIG. 7 shows an embodiment of a chip comprising a microfluidic system.

FIG. 7 shows an embodiment of a chip 600 comprising a microfluidic system 1.

Figure 8:
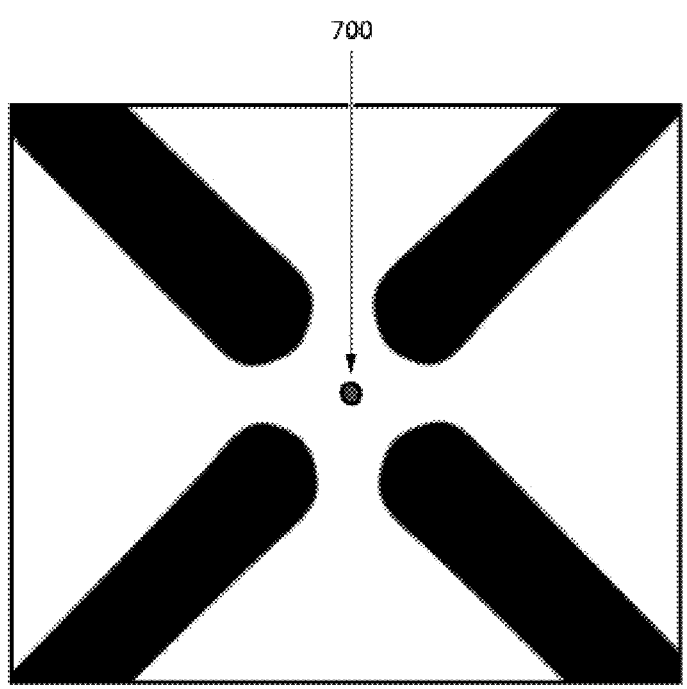
FIG. 8 shows a microscopic photo of the cultivation of a single *Corynbacterium glutamicum* cell.

FIG. 8 shows an enlarged microscopic photo of the contactless cultivation of a single *Corynbacterium glutamicum* cell 700 in the center of an octupole.

The method will be explained further by means of the following embodiment example of the separation of a microbe.

Experimental Setup

A chip was used as shown in FIG. 7 and with a channel structure of the microfluidic system as shown in FIG. 1 wherein, as a deviation, the drains 14 and 20 (see FIG. 1) were joined to a common exit.

The chip was built into a chip coupling (H, Kortmann, L. M. Blank, A. Schmid—2009. A rapid, reliable, and automatable lab-on-a-chip interface. Lab chip 9:1455-60) in order to connect the chip microfluidically and electrically. The chip coupling allows temperature adjustment by Peltier elements. The chip integrated into the coupling was fastened to a microscope (IX71, Olympus, Japan) on an XY-table. For the control of the microelectrodes implanted in the chip, the chip was connected to a generator (Cytocon 400, Perkin Elmer, USA) by a 37-pole cable. The generator was connected to a computer (PC) and used for control of voltages and frequencies of the electrical AC fields with the Software Switch (Perkin Elmer, USA). For all described cell manipulation, the electrodes were operated at an AC voltage frequency of 6.25 MHz and used at effective voltages between 0.7 V and 4.2 V.

Three syringe pumps (SP10IWZ, World Precision Instruments Inc., USA) were connected over the coupling. Pump 1 was equipped with a 200 μl Hamilton glass syringe (ILS Innovative Labor Systeme GmbH, Germany) and connected to the entrance 40 of the microfluidic system shown in FIG. 1. Pump 2 was equipped with a 10 μm Hamilton glass syringe (ILS Innovative Labor Systeme GmbH, Germany) and connected to entrance 50 (see FIG. 1). Pump 3 was equipped with a 10 ml Hamilton glass syringe (ILS Innovative Labor Systeme GmbH, Germany) and connected to entrance 70 (see FIG. 1). The syringes built into the pumps were filled with the same and used for the cell type, BHI (Brain Heart Infusion)-Complex Medium. The BHI-medium was produced by dissolving 37 g of BHI powder (Carl Roth GmbH+Co. KG, Karlsruhe, Germany) in 1 L of demineralized water and autoclaving.

Valves were placed behind all exits. For cell injection a four-way valve (1120, Omnift, Germany) was built in between entrance 40 (FIG. 1) and pump 1. A rotatable channel in the valve could be filled with a cell suspension. Then, the valve channel was turned around pump 1 to connect with the chip. This allowed a flush in of a defined volume on the cell suspension. The pumps were connected to a computer and flow volume was controlled with Software Switch (Perkin Elmer, USA). The method described in the following was carried out in the 20 μm electrode design which was designed for a channel height of 20 μm.

A microbe of the bacterial strain *Corynebacterium glutamicum* ATCC 13032 (DMSZ-Deutsche Sammlung von Mikroorganismen and Zellkulturen GmbH) was separated. For precultures as well as single cell manipulations in the chip, Brain Heart Infusion (BHI) medium (Carl Roth GmbH+Co. KG, Karlsruhe, Germany) was used.

Before the injection of cells, the chip was constructed with the abovementioned coupling, and all channels and connections were flushed with 70% ethanol, sterile filtered water and medium to clean, sterilize and prepare the system for cell manipulations.

For the preculture, 3 ml BHI-complex medium was inoculated with a bacteria colony of BHI agar plate and cultivated overnight in reagent glasses in a compact shaker (KS 15 control, Edmund Bühler GmbH, Hechingen, Germany) at 30° C. and 300 rev./min. Thereafter, 0.5 ml of the culture was transferred into a 2.5 ml BHI-complex medium and incubated for 3 hours at 30° C. and 300 rev./min. From this preculture, 0.1 ml was drawn with a 0.2 ml one-way syringe and injected directly into the four-way rotary valve. The inside volume of the rotary valve channel was 9.6 μL. By shifting the rotary valve, the channel filled with 9.6 μL cell suspension was connected to pump 1 and the chip entrance 40 (FIG. 1). Subsequently, the valve at the exit of the drains 20 and 40 (FIG. 1) were opened; a volume of 200 pL/s was delivered with pump 1, and the preseparation chamber (preseparation chamber 10, FIG. 2) was observed using a microscope (IX71, Olympus, Japan).

Electrodes 120, 126 and 128 in the preseparation were controlled with an effective voltage of 3.5 V. Before the arrival of the first cells, only electrodes 120, 122 and 124 were activated with 3.5 V by which the cells began to be guided over the drain 14 to the exit. The activation of electrode 128 caused a deflection of the bacteria in front of electrode 122. After arrival of the cells, the number of corynebacteria in front of the electrodes 122 and 124 was reduced with the activation of electrode 126.

The corynebacteria were in various phases of growth and were still linked partially with their daughter cells in a V-shape, typical for these bacteria. In order to separate single cells from the cell mix, not linked in the V-shape, and lead into the separation chamber (separation chamber 16, FIG. 1), the voltage was reduced from 3.5 to 1.4 V for 5 seconds. This caused single cells to be directed into the separation chamber while cell agglomerates and linked cells were lead to the exit through the drain 14. After directing the portion of cells off into the separation chamber, all electrodes including electrodes 120, 122 and 124 were deactivated and the voltage of electrodes 120, 122 and 124 was increased in order to prevent a possible influx of other cells into the separation chamber.

Electrode 218 was activated in the separation chamber for focusing the cell fraction on the octupole center (octupole center 222, FIG. 3). All electrodes in the separation chamber were controlled with an effective voltage of 2.83 V. Either a cell was captured without contact directly by the activation of the field cage in the octupole field cage 230 with negative dielectrophoresis and later following cells separated by alternating operation in the ACC and ROT X mode around the field cage and flushed out through the drain 20, or the separated cell fraction was first accumulated in front of the field cage by a constant ROT X mode control and then lined up one after another through the field cage center by the field mode ACB. After this lining up of cells, a cell could be isolated by a change in the field mode ROT X, and the rest of the cells in front of the octupole again could be flushed out of the chip by the change of the force field modes (ACC and ROT X, T. Muller, A. Pfenning, P. Klein, G. Gradl, M. Jager, T. Schnelle—2003. The potential of dielectrophoresis for single-cell experiments. IEEE Eng. Med. Biol. 22:51-61; T. Schnelle, T. Muller, G. Fuhr—2000. Trapping in AC octode field cage. J Electrostat 50: 17-29) over the drain 20.

After the isolation of a selected single cell, pump 1 was stopped, the exit of drains 14 and 20 was closed and exit 60 (FIG. 1) was opened. After the activation of pump 2 with a volume flow of 80 pL/s, all electrodes were deactivated in the separation chamber and the isolated cell flushed into the cultivation chamber (cultivation 22, FIG. 4). All electrodes in the cultivation chamber were controlled with a voltage of 2.83 V. In the cultivation chamber, the cell was focused on the center 312 of the octupole electrode by the funnel electrode 310 and held in the center of the electrode with the ROT X mode of a control in the fluid stream by the resultant negative dielectrophoretic force. By the described chip coupling the tempering was first adjusted so that in the center 312 of the octupole electrode a temperature of 30° C. prevailed after the activation in the ROT X mode. The cell was filmed by the microscope over a period of ca. 3 hours and its growth observed. During this time, the medium flowing around the cell and escaping behind the exit 60 was contained in a connected glass capillary. After the 3 hours, because of cell division, there were ca. 10 cells in the field cage. Then, pump 2 was stopped and exit 60 (FIG. 1) closed and the cells flushed with a flow volume of 10 nL/s into an external cultivation vessel by opening the valve 80 and activating pump 3.

The isolated and contactlessly cultivated single cells grew in the controlled microenvironment stably and very quickly. Compared with the maximum exponential growth rate in cultures, the bacteria cells showed an up to 32% faster growth in the chip. Furthermore, the growth of the cells could be observed without surface modification. This represents one advantage as cells could only be held on surfaces up to now.

Also, single cells could be well and completely separated. Moreover, the cells of a separated cell fraction could be accumulated and then lined up one after the other. In particular, it could be shown that single cells could be trapped in a completely isolated condition and contactlessly. This allows isolated and contactless, cultivated single cells to be able to be systematically manipulated in a controlled microenvironment.

The method for separation of polarizable bioparticles was as described in the above repeated with *Corynebacterium glutamicum* MH 20-22B (Forschungszentrum Jülich), the eukaryotic strain *Hansenula polymorpha* RB 11 (M. Piontek, ARTES 2 Biotechnology, Langenfeld, Germany) and human blood.

Brain Heart Infusion (BHI) medium was used in the chip for the bacteria in the preculture and single cell manipulation. For the eukaryotes YPD medium (10 g bacto-yeast extract (Carl Roth GmbH+Co. KG, Karlsruhe, Germany), 20 g 2% bacto-peptone (Carl Roth GmbH+Co. KG, Karlsruhe, Germany) and 20 g 2% dextrose (Carl Roth GmbH+Co. KG, Karlsruhe, Germany) dissolved in 1 L of demineralized (VE) water and autoclaved) was used. For the use of the method on blood cells ca. 10 µL of blood by pricking the index finger tip with the Ascensia Microlet Lancet System (Bayer, Germany) was put in a 0.5 isotonic sterile saline solution (9 g NaCl (Carl Roth GmbH, Germany) in 1 L demineralized (VE) water). All solutions were sterilely filtered before use.

It was shown that the eukaryotes and blood platelets could likewise be trapped in a completely isolated condition and contactlessly.

The invention claimed is:

1. A method for the separation of a single polarizable bioparticle with a microfluidic system, comprising the following steps:
    a) dielectrophoretic preseparation of the polarizable bioparticle from a suspension of bioparticles;
    b) fluidic separation of the polarizable bioparticle selected in step a) by trapping the polarizable bioparticle in a dielectrophoretic field cage and circulating fluid around the polarizable bioparticle;
    c) transfer of the polarizable bioparticle separated in step b) out of the dielectrophoretic field cage into a cultivation chamber; and
    d) dielectrophoretic trapping of the polarizable bioparticle separated in step b) in the cultivation chamber and study, observation, manipulation and/or cultivation of the polarizable bioparticle, wherein the polarizable bioparticle has a diameter in the range of $\geq 0.5$ µm to $\leq 5$ µm.

2. The method of claim 1, wherein analytes of the polarizable bioparticle separated in step b) are removed from the cultivation chamber for analysis.

3. The method of claim 2, wherein the analyte or analytes of the polarizable bioparticle separated in step b) are analyzed by optical and/or non-optical methods.

4. The method of claim 1, wherein the dielectrophoretic trapping of the polarizable bioparticle separated in step b) in the cultivation chamber occurs in a further dielectrophoretic field cage and/or by means of an electrode arrangement.

5. The method of claim 1, wherein, after study, observation and/or manipulation, the polarizable bioparticle separated in step b) is led away alive for propagation in a population.

\* \* \* \* \*